United States Patent
Cleary et al.

(10) Patent No.: US 7,272,365 B2
(45) Date of Patent: Sep. 18, 2007

(54) FREQUENCY OFFSET CORRECTION IN TRANSMITTERS HAVING NON-IDEAL SYNTHESIZER CHANNEL SPACING

(75) Inventors: Dennis Cleary, Morris Plains, NJ (US); Carmine Pagano, Blairstown, NJ (US); Hayim Vitali Penso, Bronx, NY (US); John Rucki, New Providence, NJ (US)

(73) Assignee: Andrew Corporation, Westchester, IL (US)

( * ) Notice: Subject to any disclaimer, the term of this patent is extended or adjusted under 35 U.S.C. 154(b) by 412 days.

(21) Appl. No.: 10/739,549

(22) Filed: Dec. 18, 2003

(65) Prior Publication Data

US 2005/0136877 A1 Jun. 23, 2005

(51) Int. Cl.
*H04B 1/02* (2006.01)
*H04B 1/66* (2006.01)
(52) U.S. Cl. .................. 455/102; 455/118; 455/91
(58) Field of Classification Search .......... 455/102, 455/118, 119, 120, 114.2, 91, 101, 114.1, 455/129, 114.3
See application file for complete search history.

(56) References Cited

U.S. PATENT DOCUMENTS 5,521,534 A * 5/1996 Elliott ..................... 327/129

2001/0029171 A1 * 10/2001 Inahasi ..................... 455/118
2003/0087613 A1 * 5/2003 Bellaouar et al. .......... 455/91
2004/0087313 A1 * 5/2004 Reid ........................ 455/455

* cited by examiner

*Primary Examiner*—Edward F. Urban
*Assistant Examiner*—Christian Hannon
(74) *Attorney, Agent, or Firm*—Steve Mendelsohn

(57) ABSTRACT

In a receiver of a transmission system in which the data transmission rate is not an integer multiple of the spacing between transmission channels, a single oscillator is used to generate both the system clock used to process the data signal as well as the mixing signal used to downconvert the received RF signal to an intermediate frequency (IF). The frequency error in the IF signal that results from mixing the RF signal at a less-than-ideal mixing frequency is compensated by selecting an appropriate mixing signal frequency applied when downconverting the IF signal to baseband. In a transmitter, the mixing signal frequency used to upconvert the outgoing baseband signal to IF is selected to pre-compensate for the frequency error resulting from upconverting the IF signal to RF using a less-than-ideal mixing frequency. In either case, the receiver/transmitter can be implemented without having to provide a dedicated reference oscillator for converting signals between RF and IF.

34 Claims, 4 Drawing Sheets

FREQUENCY OFFSET CORRECTION IN TRANSMITTERS HAVING NON-IDEAL SYNTHESIZER CHANNEL SPACING

FIELD OF THE INVENTION

The present invention relates to signal processing, and, in particular, to radio transmitters and receivers.

BACKGROUND OF THE INVENTION

In conventional radio transmitters and receivers used for data communications, the reference clock frequency used by a synthesizer is an integer multiple of the channel spacing or frequency tuning raster for the communications system. Such radio transmitters and receivers typically have a system clock for digital clocking purposes, but the system clock's frequency is usually related to the data transmission rate and is often not an integer multiple of the channel spacing (i.e., the system clock frequency and the synthesizer's phase detector frequency have a non-integer relationship). In that case, another oscillator is added solely to provide a reference clock for the synthesizers. An additional complication is that the reference oscillator for the synthesizer often needs to be phase-locked to the system clock.

FIG. 1 shows a high-level block diagram of a conventional radio receiver 100 of the prior art. Those skilled in the art will understand that certain elements such as filters, amplifiers, attenuators, and the like have been omitted from this figure, as well as from other figures of receivers and transmitters in this application.

As indicated in FIG. 1, receiver 100 receives a radio frequency (RF) input signal 102 from an antenna. Mixer 104 downconverts input signal 102 from RF to an intermediate frequency (IF) to form IF signal 106. Analog-to-digital converter (ADC) 108 converts the analog IF signal 106 into a digital IF signal 110. Digital downconverter 112 converts digital IF signal 110 into a baseband signal 114, which is then subjected to further digital processing 116 to generate digital incoming data signal 118.

In order to convert RF input signal 102 to IF, mixer 104 receives a mixing signal 120 from synthesizer 122. Synthesizer 122, which has an internal oscillator configured to a phase-locked loop (PLL), generates mixing signal 120 using a reference clock generated by reference oscillator 134.

In one possible application of receiver 100, RF input signal 102 carries data modulated at one or more frequencies from 1920 MHz to 1980 MHz in 200-kHz increments (i.e., channel frequencies of 1920 MHz, 1920.2 MHz, 1920.4 MHz, ..., 1980 MHz). In one possible implementation for such an application, receiver 100 can be tuned to any one of the channels, but always downconverts the selected channel to an IF of 77.8 MHz. In order to downconvert any channel in RF input signal 102 to a 77.8-MHz IF signal, synthesizer 122 is able to generate mixing signal 120 with any frequency from 1842.2 MHz to 1902.2 MHz in 200-kHz increments, where a 1842.2-MHz mixing frequency is used to downconvert the 1920-MHz channel to 77.8-MHz IF, a 1844.2-MHz mixing frequency is used to downconvert the 1922-MHz channel to 77.8-MHz IF, and so on.

In order to enable synthesizer 122 to generate any of these different mixing frequencies, reference oscillator 134 generates reference clock signal 132 having an appropriate frequency. For example, in one possible implementation, reference clock signal 132 has a frequency of 10 MHz. In that case, synthesizer 122 is able to generate any of the appropriate mixing signal frequencies to match the 200-kHz channel spacing in RF input signal 102.

Similarly, in order to digitally downconvert digital IF signal 110 to baseband, digital downconverter 112 receives a mixing signal 124 from numerically controlled oscillator (NCO) 126. Ideally, mixing signal 124 has a frequency of 16.36 MHz. Those skilled in the art will recognize the receiver as a sampled IF architecture (Nyquist sampling), where the relationship between the sample clock frequency $F_s$, the analog IF frequency $F_{IFa}$, and the digital IF frequency $F_{IFd}$ can be expressed by the following equations:

$$F_{IFd} = F_s/4$$

and $$F_{IFa} = (n*2-1)*F_{IFd},$$

where n is the Nyquist sampling zone (1, 2, 3, etc.). In the present example, Fs is 61.44 MHz, $F_{IFd}$ is 15.36 MHz, and n is 3. Therefore, $F_{IFa}$ is 76.8 MHz. The analog IF frequency $F_{IFa}$ has been offset by 1 MHz to 77.8 MHz to move spurious emissions to frequencies with less stringent leakage requirements for this particular application. As such, the digital IF frequency $F_{IFd}$ is also offset by 1 MHz to 16.36 MHz.

In one possible application, the speed of digital processing 116, which is dictated by the data transmission rate, is based on a system clock signal 128 having a frequency of 61.44 MHz, which is generated by system oscillator 130. Note that, in preferred implementations, system clock signal 128 is also provided to reference oscillator 134 to synchronize (i.e., phase-lock) reference oscillator 134 with system oscillator 130.

FIG. 2 shows a high-level block diagram of a conventional radio transmitter 200 of the prior art. In one possible application, transmitter 200 is designed and operated to generate an RF signal for transmission to receiver 100 of FIG. 1, where the RF signal corresponds to any one of the channels supported by receiver 100.

To support this functionality, transmitter 200 applies digital processing 204 to an outgoing data signal 202 based on a 61.44-MHz system clock signal 228 from system oscillator 230 to generate baseband signal 206. Digital upconverter 208 upconverts baseband signal 206 into digital IF signal 210 based on a 16.36-MHz mixing signal 224 from numerically controlled oscillator 226. Digital-to-analog converter (DAC) 212 converts digital IF signal 210 into 77.8-MHz analog IF signal 214. Mixer 216 upconverts IF signal 214 into RF signal 218 based on an appropriate mixing signal 220 from synthesizer 222, where the frequency of the mixing signal (i.e., any one frequency from 1842.2 MHz to 1902.2 MHz in 200-kHz increments) is selected based on the desired channel frequency of RF signal 218 (i.e., any one frequency from 1920 MHz to 1980 MHz in 200-kHz increments). Here, too, synthesizer 222 is able to generate any one of the appropriate mixing frequencies based on, e.g., a 10-MHz reference clock signal 232 received from reference oscillator 234, where reference oscillator 234 is synchronized with system oscillator 230.

BRIEF DESCRIPTION OF THE DRAWINGS

Aspects, features, and advantages of the present invention will become more fully apparent from the following detailed description, the appended claims, and the accompanying drawings in which like reference numerals identify similar or identical elements.

DETAILED DESCRIPTION

Receiver

Figure 1:
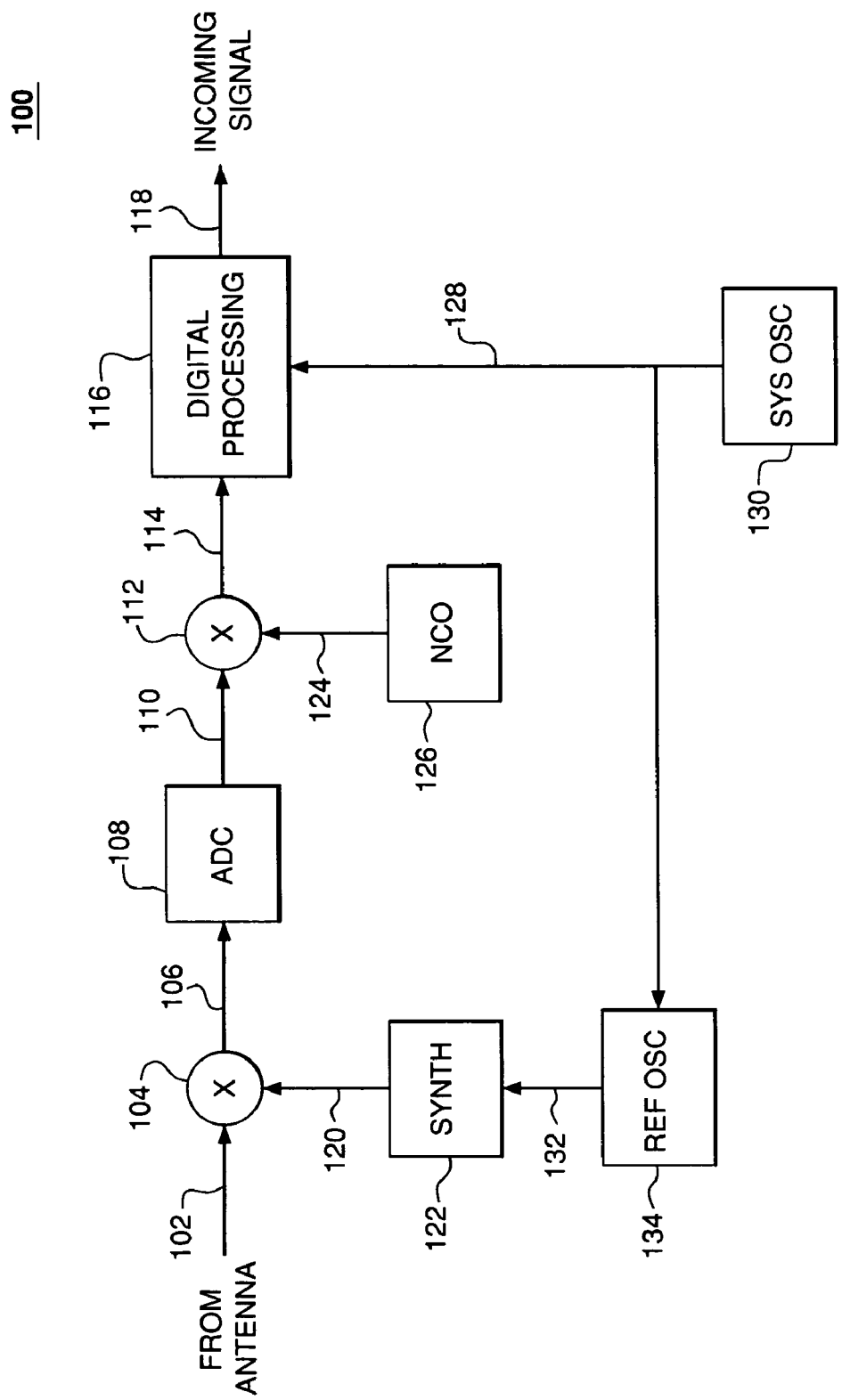
FIG. 1 shows a high-level block diagram of a conventional radio receiver of the prior art.
Figure 3:
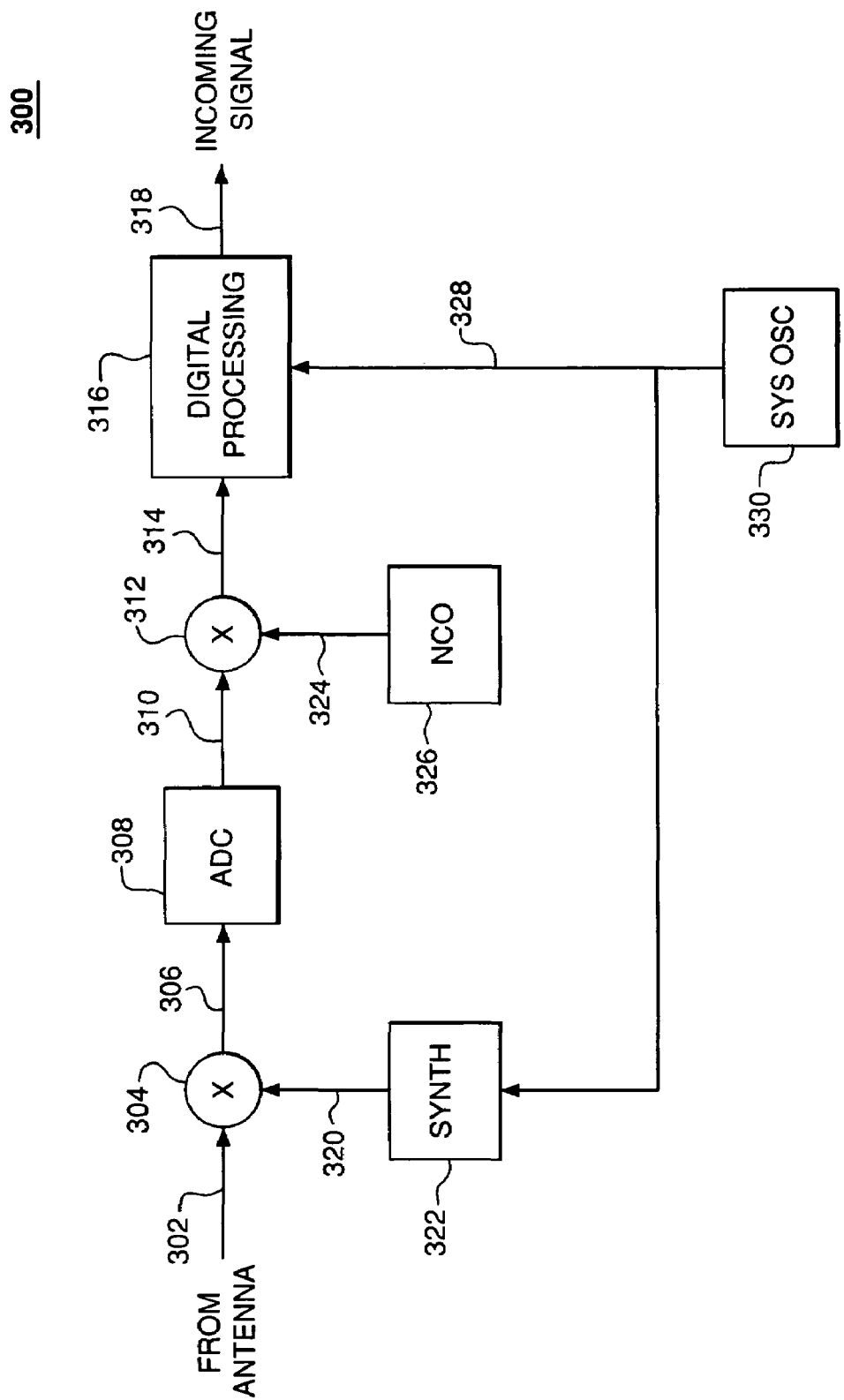
FIG. 3 shows a high-level block diagram of a radio receiver, according to one embodiment of the present invention.

FIG. 3 shows a high-level block diagram of a radio receiver 300, according to one embodiment of the present invention. Receiver 300 is similar to prior-art receiver 100 of FIG. 1, with corresponding elements 302-330 performing similar functions as elements 102-130 of FIG. 1, except that receiver 300 does not have a dedicated reference oscillator similar to reference oscillator 134 of receiver 100. Rather, in receiver 300, synthesizer 322 is driven directly by system clock signal 328 generated by system oscillator 330.

In the same possible application as the one described previously for receiver 100, receiver 300 is designed and tuned to operate for any channel in RF input signal 302 having a frequency from 1920 MHz to 1980 MHz in 200-kHz increments. As in receiver 100, in order to downconvert RF input signal 302 to IF, mixer 304 applies a mixing signal 320 generated by synthesizer 322. In receiver 300, however, synthesizer 322 uses 61.44-MHz system clock signal 328 from system oscillator 330 as its reference, rather than a special (e.g., 10-MHz) reference clock signal generated by a second (e.g., reference) oscillator.

Because system clock signal 328 has a frequency of 61.44 MHz, synthesizer 322 is not able to match identically the desired channel spacing of 200 kHz. Instead, the closest synthesizer 322 is able to do is to generate mixing signals having a channel spacing of 200.130 kHz (corresponding to 61.44 MHz/307). As a result, for most (if not all) RF channel frequencies, the frequency of IF signal 306 generated by mixer 304 will not be exactly 77.8 MHz. To compensate for the frequency error in IF signal 306, numerically controlled oscillator 326 is programmed to generate mixing signal 324 having a frequency that sufficiently differs from the ideal 16.36 MHz to undo the error resulting from downconverting from RF to IF using a less-than-ideal mixing signal 320. When receiver 300 is operated appropriately, baseband signal 314 generated by digital downconverter 312 will be sufficiently close to the ideal baseband signal to enable digital processing 316 to be accurately performed based on the 61.44-MHz system clock signal 328.

For example, assume that receiver 300 is to be tuned to select the 1922.4-MHz channel in RF input signal 302. In order to convert this channel to a 77.8-MHz IF signal, mixer 304 would ideally apply a mixing signal having a frequency of 1844.6 MHz, where (1922.4-1844.6)=77.8. However, the closest synthesizer 322 can get using 61.44-MHz system clock signal as its reference is about 1844.600912052 MHz. As a result, IF signal 306 will have a frequency of about 77.799087948 MHz, instead of the ideal 77.8 MHz, corresponding to a frequency error of about −912.052 Hz. If this error were allowed to remain, it is possible that digital processing 316 would result in an unacceptably high bit error rate in incoming data signal 318.

Instead of generating a mixing signal of exactly 16.36 MHz, NCO 326 is programmed to generate a mixing signal to compensate for the error in IF signal 306. For example, for the case of the 1922.4-MHz channel and its corresponding −912.052-Hz error, NCO 326 generates mixing signal 324 having a frequency of about 16.35908795 MHz. This results in a baseband signal 314 having an error of about −0.006 Hz, which is well within the 1-Hz tolerance of typical implementations of signal processing 316.

In this particular application, the largest RF-to-IF mixing error for receiver 300 occurs in the highest-frequency RF channel (i.e., 1980 MHz). In this case, IF signal 306 has a frequency error of −38,436.482 Hz. To compensate for this RF-to-IF mixing error, NCO 326 generates mixing signal 324 having a frequency of 16.32156352 MHz, resulting in a frequency error in baseband signal 314 of only −0.003 Hz. As long as NCO 326 has sufficient precision and range, it can be used to compensate for any RF-to-IF mixing error resulting from using the 61.44-MHz system clock as the reference for synthesizer 322. In one implementation, NCO 326 is a 32-bit NCO having a raster of about 0.0143 Hz (i.e., 61.44 MHz/$2^{32}$) and a tuning range from DC to (61.44 MHz/2), more than sufficient to provide mixing signals 324 with sufficient precision and range to compensate for any RF-to-IF mixing error over the entire bandwidth of channels in RF signal 302.

In this way, receiver 300 of the present invention can be implemented without having to provide a dedicated oscillator similar to reference oscillator 134 of prior-art receiver 100, even when the system clock signal generated by system oscillator 330 is not an integer multiple of the desired channel spacing.

Transmitter

Figure 4:
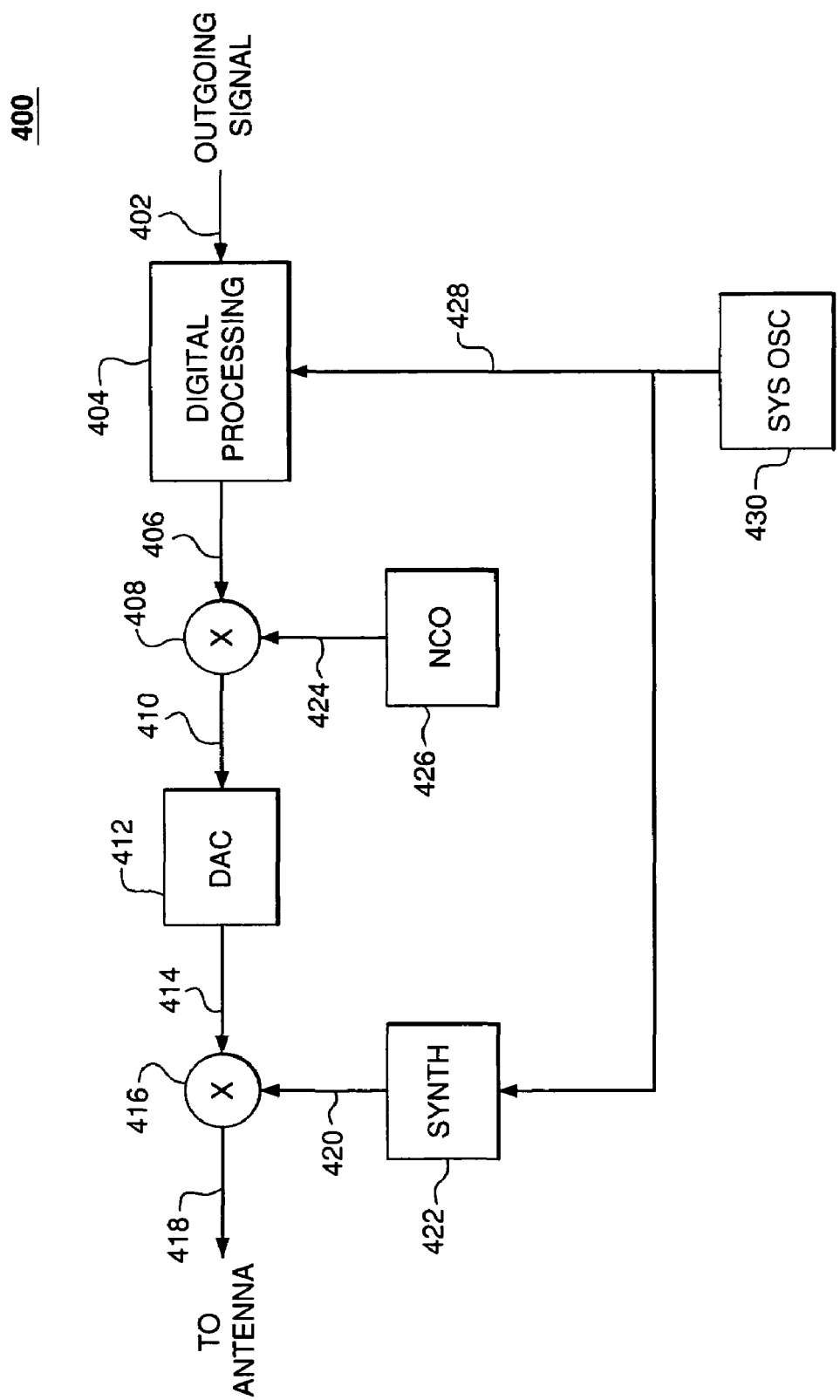
FIG. 4 shows a high-level block diagram of a radio transmitter, according to one embodiment of the present invention.

FIG. 4 shows a high-level block diagram of a radio transmitter 400, according to one embodiment of the present invention. As with prior-art transmitter 200 of FIG. 2, in one possible application, transmitter 400 is designed and operated to generate an RF signal for transmission to receiver 300 of FIG. 3, where the RF signal corresponds to any one of the channels supported by receiver 100. Note that, transmitter 400 can generate RF signals for transmission to either prior-art receiver 100 or receiver 300 of the present invention. By the same token, receiver 300 of the present invention can receive RF signals generated by either prior-art transmitter 200 or transmitter 400 of the present invention.

Figure 2:
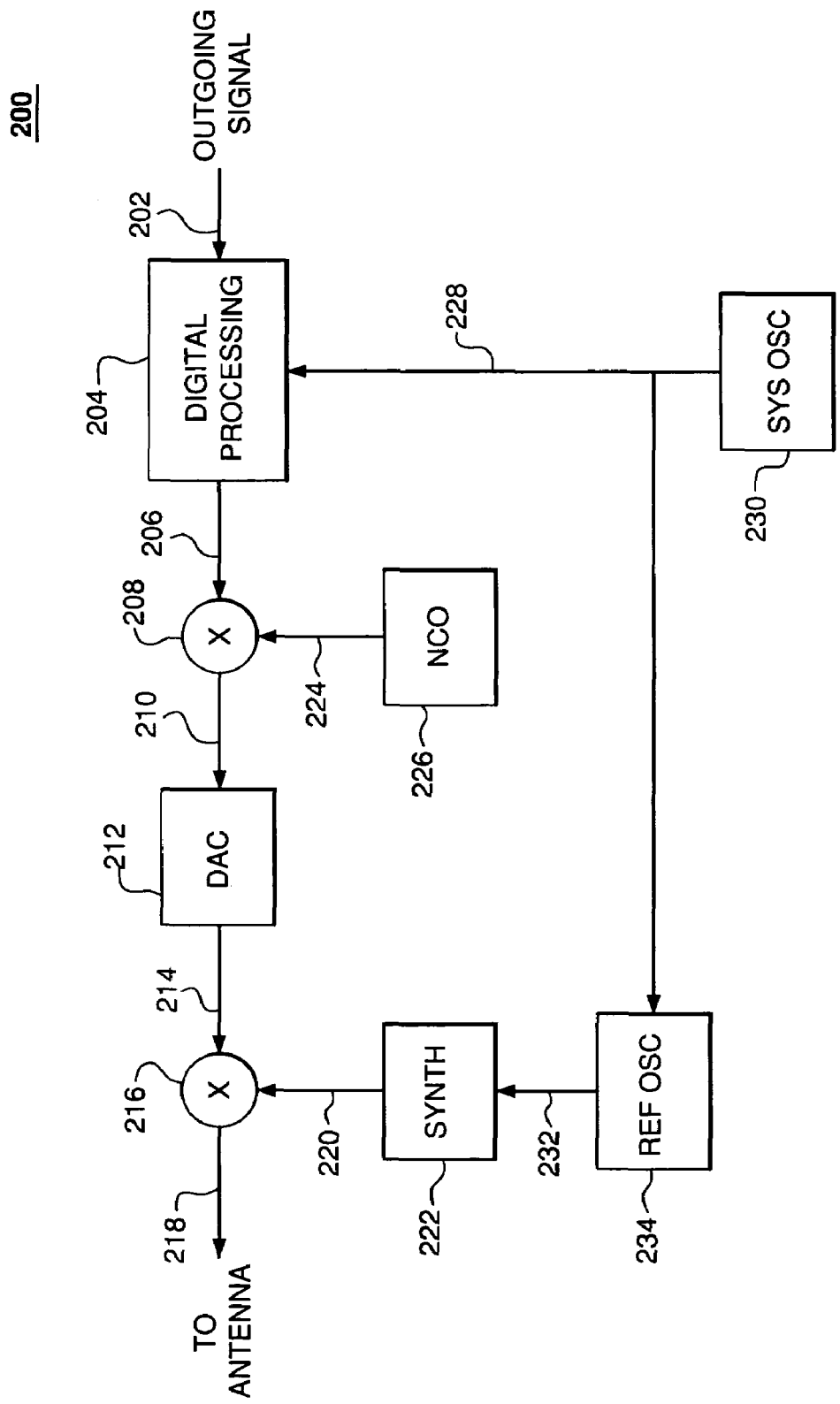
FIG. 2 shows a high-level block diagram of a conventional radio transmitter of the prior art.

Similar to the relationship between receiver 300 and prior-art receiver 100, transmitter 400 is similar to prior-art transmitter 200 of FIG. 2, with corresponding elements 402-430 performing similar functions as elements 202-230 of FIG. 2, except that transmitter 400 does not have a dedicated reference oscillator similar to reference oscillator 234 of transmitter 200. Rather, in transmitter 400, synthesizer 422 is driven directly by system clock signal 428 generated by system oscillator 430.

To support this functionality, transmitter 400 applies digital processing 404 to an outgoing data signal 402 based on a 61.44-MHz system clock signal 428 from system oscillator 430 to generate baseband signal 406. Digital upconverter 408 upconverts baseband signal 406 into digital IF signal 410 based on an appropriate mixing signal 424 from numerically controlled oscillator 426. DAC 412 converts digital IF signal 410 into an analog IF signal 414. Mixer 416 upconverts IF signal 414 into RF signal 418 based on an appropriate mixing signal 420 from synthesizer 422, where the frequency of the mixing signal is selected based on the desired channel frequency of RF signal 418 (i.e., any one frequency from 1920 MHz to 1980 MHz in 200-KHz increments).

As in receiver 300 of FIG. 3, synthesizer 422 of transmitter 400 is not able to match identically the desired channel spacing of 200 kHz. To pre-compensate for this channel-spacing mismatch, NCO 426 generates mixing signal 424 having a frequency specifically selected to ensure that the resulting RF signal 418 is sufficiently close to the desired RF channel frequency.

Returning to the earlier example of the 1922.4-MHz channel, in order to generate RF output signal 418 at this frequency, NCO 426 generates mixing signal 424 having a frequency of about 16.35908795 MHz. This results in IF signal 414 having a pre-compensated frequency error of about +912.052 Hz. When mixer 416 applies mixing signal 420 having a frequency of about 1844.600912052 MHz, the 912.052-Hz difference between this mixing frequency and the ideal mixing frequency of 1844.6 MHz results in RF output signal 418 having the desired 1922.4-MHz channel frequency.

In this way, transmitter 400 of the present invention can be implemented without having to provide a dedicated oscillator similar to reference oscillator 234 of prior-art transmitter 200, even when the system clock signal generated by system oscillator 430 is not an integer multiple of the desired channel spacing.

ALTERNATIVE EMBODIMENTS

The present invention has been described in the context of a transmission system having a particular range of RF transmission frequencies (i.e., 1920-1980 MHz) with a particular channel spacing (i.e., 200 kHz) and transmitters and receivers having a particular desired intermediate frequency (i.e., 77.8 MHz) and a particular system clock speed (i.e., 61.44 MHz). Those skilled in the art will understand that the present invention can be implemented for other transmission systems and other transmitters and receivers in which one or more or even all of these particular values and/or sets of values is different from those described earlier.

Although the present invention has been described in the context of a receiver and a transmitter that have a synthesizer that uses a PLL to generate an analog mixing signal for converting between RF and IF, other suitable types of mixing signal generators could be used, such as a synthesizer that uses a delay-locked loop (DLL).

Although the present invention has been described in the context of a receiver that downconverts from RF to IF in the analog domain and from IF to baseband in the digital domain and a transmitter that upconverts from baseband to IF in the digital domain and from IF to RF in the analog domain, in theory, the present invention can be implemented in the context of receivers and/or transmitters that downconvert and upconvert, respectively, either entirely in the analog domain or entirely in the digital domain.

Embodiments of the present invention may be implemented as circuit-based processes, including possible implementation on a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. In a multi-channel transmitter having a specified channel spacing, a method comprising:
   generating a first mixing signal;
   upconverting a baseband signal to an intermediate frequency (IF) by mixing the baseband signal using the first mixing signal;
   generating a second mixing signal using a reference signal whose frequency is a non-integer multiple of the channel spacing for the transmitter; and
   upconverting the IF signal to generate an outgoing signal having an outgoing frequency by mixing the IF signal using the second mixing signal whose frequency differs from an ideal mixing frequency for the outgoing signal as a result of the frequency of the reference signal being the non-integer multiple of the channel spacing for the transmitter, wherein:
      the frequency of the first mixing signal is selected based on a frequency difference between the frequency of the second mixing signal and the ideal mixing frequency, such that, the first mixing signal pre-compensates for the frequency difference between the second mixing signal frequency and the ideal mixing frequency.

2. The invention of claim 1, wherein:
   the outgoing frequency is a radio frequency;
   the upconversion from baseband to IF is implemented in a digital domain; and
   the upconversion from IF to RF is implemented in an analog domain, wherein the IF signal is D/A converted prior to being upconverted to RF.

3. The invention of claim 1, further comprising:
   selecting a channel in the outgoing signal;
   selecting the frequency of the second mixing signal based on the selected channel; and
   selecting the frequency of the first mixing signal based on the frequency difference between the second signal mixing frequency and the ideal mixing frequency.

4. The invention of claim 3, further comprising:
   selecting a new channel in the outgoing signal;
   selecting a new frequency for the second mixing signal based on the new channel; and
   selecting a new frequency for the first mixing signal based on a new frequency difference between the new frequency for the second mixing signal and a new ideal frequency for the second mixing signal.

5. The invention of claim 1, wherein the second mixing signal is generated from an oscillator that is also used to generate a clock signal used to encode data in the outgoing signal.

6. The invention of claim 5, wherein the frequency of the clock signal and a phase detector frequency of a synthesizer that generates the first mixing signal have a non-integer relationship.

7. The invention of claim 5, wherein the second mixing signal and the clock signal used to encode the data in the outgoing signal are generated based on only a single reference clock source.

8. The invention of claim 1, wherein a data transmission rate for the outgoing signal and a phase detector frequency of a synthesizer that generates the first mixing signal have a non-integer relationship.

9. A multi-channel transmitter having a specified channel spacing, the transmitter comprising:
- a first mixing signal generator adapted to generate a first mixing signal;
- a first upconverter adapted to upconvert a baseband signal to an intermediate frequency (IF) by mixing the baseband signal using the first mixing signal;
- a second mixing signal generator adapted to generate a second mixing signal using a reference signal whose frequency is a non-integer multiple of the channel spacing for the transmitter; and
- a second upconverter adapted to upconvert the IF signal to generate an outgoing signal having an outgoing frequency by mixing the IF signal using the second mixing signal whose frequency differs an ideal mixing frequency for the outgoing signal as a result of the frequency of the reference signal being the non-integer multiple of the channel spacing for the transmitter, wherein:
  - the frequency of the first mixing signal is selected based on a frequency difference between the frequency of the second mixing signal and the ideal mixing frequency, such that, the first mixing signal pre-compensates for the frequency difference between the second mixing signal frequency and the ideal mixing frequency.

10. The invention of claim 9, wherein:
the outgoing frequency is a radio frequency;
the upconversion from baseband to IF is implemented in a digital domain; and
the upconversion from IF to RF is implemented in an analog domain, wherein the IF signal is D/A converted prior to being upconverted to RF.

11. The invention of claim 9, wherein:
the frequency of the second mixing signal is selected based on a selected channel in the outgoing signal; and
the frequency of the first mixing signal is selected based on the frequency difference between the second mixing signal frequency and the ideal mixing frequency.

12. The invention of claim 11, wherein:
a new frequency for the second mixing signal is selected based on selecting a new channel in the outgoing signal; and
a new frequency for the first mixing signal is selected based on a new frequency difference between the new frequency for the second mixing signal and a new ideal frequency for the second mixing signal.

13. The invention of claim 9, wherein the second mixing signal is generated from an oscillator that is also used to generate a clock signal used to encode data in the outgoing signal.

14. The invention of claim 13, wherein the frequency of the clock signal and a phase detector frequency of a synthesizer that generates the first mixing signal have a non-integer relationship.

15. The invention of claim 13, wherein the second mixing signal and the clock signal used to encode the data in the outgoing signal are generated based on only a single reference clock source.

16. The invention of claim 9, wherein a data transmission rate for the outgoing signal and a phase detector frequency of a synthesizer that generates the first mixing signal have a non-integer relationship.

17. The invention of claim 9, further comprising:
an oscillator adapted to generate a system clock signal;
a first mixing signal generator adapted to generate the first mixing signal; and
a second mixing signal generator adapted to generate the second mixing signal from the system clock signal;
digital processing adapted to process the baseband signal based on the system clock signal.

18. The invention of claim 17, wherein:
the first upconverter is a digital upconverter adapted to convert the baseband signal into a digital if signal;
the first mixing signal generator is an NCO;
the receiver further comprises an digital-to-analog converter adapted to convert the digital IF signal into an analog IF signal;
the second upconverter is an analog mixer adapted to convert the analog IF signal into the outgoing signal; and
the second mixing signal generator is a PLL-based synthesizer.

19. The invention of claim 17, wherein the frequency of the clock signal and a phase detector frequency of a synthesizer that generates the first mixing signal have a non-integer relationship.

20. In a transmitter, a method comprising:
upconverting a baseband signal to an intermediate frequency (IF) by mixing the baseband signal using a first mixing signal; and
upconverting the if signal to generate an outgoing signal having an outgoing frequency by mixing the if signal using a second mixing signal whose frequency differs from an ideal mixing frequency for the outgoing signal, wherein:
  the frequency of the first mixing signal is selected based on a frequency difference between the frequency of the second mixing signal and the ideal mixing frequency, such that, the first mixing signal pre-compensates for the frequency difference between the second mixing signal frequency and the ideal mixing frequency;
  the second mixing signal is generated from an oscillator that is also used to generate a clock signal used to encode data in the outgoing signal; and
  the second mixing signal and the clock signal used to encode the data in the outgoing signal are generated based on only a single reference clock source.

21. The invention of claim 20, wherein:
the outgoing frequency is a radio frequency;
the upconversion from baseband to IF is implemented in a digital domain; and
the upconversion from IF to RF is implemented in an analog domain, wherein the IF signal is D/A converted prior to being upconverted to RF.

22. The invention of claim 20, further comprising:
selecting a channel in the outgoing signal;
selecting the frequency of the second mixing signal based on the selected channel; and
selecting the frequency of the first mixing signal based on the frequency difference between the second signal mixing frequency and the ideal mixing frequency.

23. The invention of claim 22, further comprising:
selecting a new channel in the outgoing signal;
selecting a new frequency for the second mixing signal based on the new channel; and
selecting a new frequency for the first mixing signal based on a new frequency difference between the new frequency for the second mixing signal and a new ideal frequency for the second mixing signal.

24. The invention of claim 20, wherein the frequency of the clock signal and a phase detector frequency of a synthesizer that generates the first mixing signal have a non-integer relationship.

25. The invention of claim 20, wherein a data transmission rate for the outgoing signal and a phase detector frequency of a synthesizer that generates the first mixing signal have a non-integer relationship.

26. A transmitter comprising:
a first upconverter adapted to upconvert a baseband signal to an intermediate frequency (IF) by mixing the baseband signal using a first mixing signal; and
a second upconverter adapted to upconvert the IF signal to generate an outgoing signal having an outgoing frequency by mixing the IF signal using a second mixing signal whose frequency from differs an ideal mixing frequency for the outgoing signal, wherein:
the frequency of the first mixing signal is selected based on a frequency difference between the frequency of the second mixing signal and the ideal mixing frequency, such that, the first mixing signal pre-compensates for the frequency difference between the second mixing signal frequency and the ideal mixing frequency;
the second mixing signal is generated from an oscillator that is also used to generate a clock signal used to encode data in the outgoing signal; and
the second mixing signal and the clock signal used to encode the data in the outgoing signal are generated based on only a single reference clock source.

27. The invention of claim 26, wherein:
the outgoing frequency is a radio frequency;
the upconversion from baseband to IF is implemented in a digital domain; and
the upconversion from IF to RF is implemented in an analog domain, wherein the IF signal is D/A converted prior to being upconverted to RF.

28. The invention of claim 26, wherein:
the frequency of the second mixing signal is selected based on a selected channel in the outgoing signal; and
the frequency of the first mixing signal is selected based on the frequency difference between the second mixing signal frequency and the ideal mixing frequency.

29. The invention of claim 28, wherein:
a new frequency for the second mixing signal is selected based on selecting a new channel in the outgoing signal; and
a new frequency for the first mixing signal is selected based on a new frequency difference between the new frequency for the second mixing signal and a new ideal frequency for the second mixing signal.

30. The invention of claim 26, wherein the frequency of the clock signal and a phase detector frequency of a synthesizer that generates the first mixing signal have a non-integer relationship.

31. The invention of claim 26, wherein a data transmission rate for the outgoing signal and a phase detector frequency of a synthesizer that generates the first mixing signal have a non-integer relationship.

32. The invention of claim 26, further comprising:
an oscillator adapted to generate a system clock signal;
a first mixing signal generator adapted to generate the first mixing signal; and
a second mixing signal generator adapted to generate the second mixing signal from the system clock signal;
digital processing adapted to process the baseband signal based on the system clock signal.

33. The invention of claim 32, wherein:
the first upconverter is a digital upconverter adapted to convert the baseband signal into a digital hF signal;
the first mixing signal generator is an NCO;
the receiver further comprises an digital-to-analog converter adapted to convert the digital IF signal into an analog IF signal;
the second upconverter is an analog mixer adapted to convert the analog IF signal into the outgoing signal; and
the second mixing signal generator is a PLL-based synthesizer.

34. The invention of claim 32, wherein the frequency of the clock signal and a phase detector frequency of a synthesizer that generates the first mixing signal have a non-integer relationship.

* * * * *

UNITED STATES PATENT AND TRADEMARK OFFICE
CERTIFICATE OF CORRECTION

PATENT NO.       : 7,272,365 B2                                    Page 1 of 1
APPLICATION NO.  : 10/739549
DATED            : September 18, 2007
INVENTOR(S)      : Dennis Cleary et al.

It is certified that error appears in the above-identified patent and that said Letters Patent is hereby corrected as shown below:

In column 8, line 7, replace "if" with --IF--.
In column 8, line 26, replace "if" with --IF--.
In column 10, line 27, replace "hF" with --IF--.

Signed and Sealed this

Thirteenth Day of May, 2008

JON W. DUDAS
*Director of the United States Patent and Trademark Office*